United States Patent [19]
Lee et al.

[11] Patent Number: 6,017,659
[45] Date of Patent: Jan. 25, 2000

[54] PHASE SHIFTING PHOTOMASK FABRICATION METHOD

[75] Inventors: Jun Seok Lee, Seoul; Dong Jin Shin, Kyungki-Do, both of Rep. of Korea

[73] Assignee: LG Semicon Co., Ltd., Choongcheongbuk-Do, Rep. of Korea

[21] Appl. No.: 09/049,471

[22] Filed: Mar. 27, 1998

[30] Foreign Application Priority Data

Jun. 21, 1997 [KR] Rep. of Korea ................... 97-26353

[51] Int. Cl.⁷ ...................................... G03F 9/00
[52] U.S. Cl. ................................. 430/5; 430/323
[58] Field of Search ................ 430/5, 322, 323, 430/311, 314, 313

[56] References Cited

U.S. PATENT DOCUMENTS

| | | | |
|---|---|---|---|
| 4,373,018 | 2/1983 | Reichmanis et al. | 430/312 |
| 5,254,418 | 10/1993 | Kamon et al. | 430/5 |
| 5,281,500 | 1/1994 | Cathey et al. | 430/5 |

OTHER PUBLICATIONS

N. Takeyasu, et al.; Characterization of Direct–Contact Via Plug Formed by Use of Selective Al–CVD; Extended Abstracts of the 1993 International Conference on Solid State Devices, 1993; pp. 180–182.

*Primary Examiner*—S. Rosasco
*Attorney, Agent, or Firm*—Morgan, Lewis & Bockius LLP

[57] ABSTRACT

A phase shifting photomask fabrication method includes the steps of forming a plurality of opaque patterns on a transparent substrate, forming a first protection layer pattern to cover portions of the opaque patterns and the transparent substrate, etching the transparent substrate to form a transmissive portion using the opaque patterns and the first protection layer pattern as a mask, forming a second protection layer on respective upper surfaces of the transmissive portion, the opaque patterns and the first protection layer pattern, removing a portion of the second protection layer to expose the first protection layer pattern, removing the first protection layer pattern and exposing the opaque patterns and the transparent substrate, growing an aluminum layer using the exposed opaque patterns as a seed to form an aluminum pattern, etching the exposed transparent substrate, anisotropically etching the aluminum pattern, and re-etching the transparent substrate surface exposed by anisotropically etching the aluminum pattern, thereby forming a phase transition region and a phase shifting region.

28 Claims, 6 Drawing Sheets

PHASE SHIFTING PHOTOMASK FABRICATION METHOD

This application claims the benefit of Korean Patent Application No. 26353/1997, filed Jun. 21, 1997, which is hereby incorporated by reference.

BACKGROUND OF THE INVENTION

1. Field of the Invention

The present invention relates to a photomask fabrication method for a semiconductor device, and, more particularly, to an alternating type phase shifting photomask fabrication method.

2. Discussion of the Related Art

FIG. 1 illustrates an alternating type phase shifting photomask according to conventional art. A plurality of opaque patterns 2 are formed on a transparent substrate 1. A phase shifter 3 and a transmissive portion 4 are alternately located between adjacent pairs of the opaque patterns 2. The phase shifter 3 partially covers a corresponding pair of the opaque patterns 2.

FIGS. 2A and 2B illustrate cross-sections taken along lines IIA—IIA and IIB—IIB of FIG. 1, respectively.

As shown in FIG. 2A, the phase shifter 3 partially covers the adjacent opaque patterns 2 to generate a phase-shift along the interface edges of the opaque patterns 2. However, as shown in FIG. 2B, because the phase shifter 3 comes into direct contact with the transparent substrate 1, a phase shift occurs on the upper surface of the transparent substrate 1.

The working principle of the conventional phase shifting photomask will now be described.

When the transparent substrate 1 is placed on an exposure device (not shown), light passes through the transparent substrate 1 (except for portions covered by the opaque patterns 2) and impinges on a wafer. That is, the light that reaches the opaque patterns 2 is blocked by the opaque patterns 2 and does not reach the wafer. The light that passes through the transparent portion 4 of the substrate 1 and the light that passes through the phase shifter 3 reach the wafer, but their respective phases are different from each other. When viewed along an X-axis as shown in FIG. 2A, the light becomes phase-shifted at the interface edges of the opaque patterns 2 because the phase shifter 3 partially covers the opaque patterns 2. Therefore, because light intensity decreases due to this sudden phase-shift, clearer exposures may be obtained with the opaque patterns 2. However, when viewed along a Y-axis as opposed to the X-axis, as shown in FIG. 2B, the transmissive portion 4 of the substrate 1 comes into direct contact with the phase shifter 3, and the phases of the light that passes through the transparent portion and the light that passes through the phase shifter 3 are 180° out of phase, so that where the transmissive portion 4 and the phase shifter 3 come in contact with each other, light intensity is reduced to nearly zero at the interface. Such a radical decrease in light intensity is illustrated in FIG. 3 showing the variation in light intensity versus distance. That is, light intensity measured at the wafer becomes almost zero at the interface portion 3a between the phase shifter 3 and the transparent substrate 1, and it is difficult to obtain a clear pattern along the interface portion 3a.

Referring to U.S. Pat. No. 5,254,418, a phase transition layer (intermediate phase shifter) is provided at the interface portion 3a between the phase shifter 3 and the transmissive portion 4 of the substrate 1, so that the phase becomes gradually shifted, preventing the light intensity from becoming zero (nulled), thus obtaining a clear pattern at the interface portion 3a between the phase shifter 3 and the transparent portion 4.

Referring to FIG. 4 illustrating the method according to U.S. Pat. No. 5,254,418, a plurality of opaque patterns 12 are formed on a transparent substrate 11. A phase shifter 13 is formed on the transparent substrate 11 to partially cover the opaque patterns 12. A phase transition layer 14 is formed entirely covering the transparent substrate 11, the opaque patterns 12 and the phase shifter 13.

The fabrication method of such a composed phase shifting photomask will now be described with reference to FIGS. 5A–5C.

First, as shown in FIG. 5A, a chromium film serving as an opaque layer is deposited on the transparent substrate 11 by using a known sputtering method and an E-beam evaporation method. The chromium film is selectively removed to form a predetermined pattern, obtaining a chromium pattern serving as the opaque pattern 12. An $SiO_2$ film is formed by using a known CVD (chemical vapor deposition) method entirely covering the transparent substrate 11 and the opaque pattern 12. A positive type photoresist film 20 (which is positive to the E-beam) is formed on the $SiO_2$ film using a spin-coat method.

As shown in FIG. 5B, a resist pattern 20a corresponding to the phase shifter 13 in FIG. 4 is formed by selectively exposing the resist film 20 using the E-beam.

Using the resist pattern 20a as a mask, the $SiO_2$ film is etched by an RIE (reactive ion etching) method, forming the phase shifter 13. Then, the resist pattern 20a is eliminated by $O_2$ plasma etching.

As further shown in FIG. 5C, the phase transition layer 14 serving as a second phase shifting layer is formed on the transparent substrate 11 including the opaque patterns 12 and the phase shifter 13. Here, the second phase transition layer 14 has high viscosity and is formed by an SOG (spin on glass) method having a high reflow characteristic, so that a gradual slope exists along the interface between the phase shifter 13 and the transparent substrate 11. As a result, the light phase does not drastically shift from zero to 180 degrees at the interface region 13a of the phase shifter 13, and the phase shifting occurs gradually so that light intensity does not fall to zero, thereby obtaining a more distinct pattern on the wafer. When the phase transition layer 14 is formed, the variation in light intensity at the interface portion between the phase shifter 13 and the transparent mask substrate 11 is as shown in FIG. 6.

However, when forming a layer in which a phase shift gradually occurs because two phase shifting layers are formed, light transmission decreases. Also, because light reflection and dispersion are greater at the interface portion of the two separate phase shifting layers 13 and 14, the resolution of the mask decreases. In addition, the use of two phase shifting layers increases the size of the phase interface region and decreases mask integration.

SUMMARY OF THE INVENTION

Accordingly, the present invention is directed to a phase shifting photomask fabrication method that substantially obviates one or more of the problems due to the limitations and disadvantages of the related art.

An object of the present invention is to provide a phase shifting photomask fabrication method where a phase shifter employs a transparent mask substrate and a phase transition portion having a plurality of steps formed using self-alignment and without using extra masking steps.

To achieve these and other advantages, and in accordance with the purpose of the present invention, as embodied and broadly described, in a first aspect of the present invention there is provided a phase shifting photomask fabrication method including the steps of forming opaque patterns on a substrate, forming a first protection layer pattern covering portions of the opaque patterns and the substrate, etching the substrate to form a recessed transmissive portion using the opaque patterns and the first protection layer pattern as a mask, forming a second protection layer over the transmissive portion, the opaque patterns and the first protection layer pattern, removing a portion of the second protection layer to expose the first protection layer, removing the first protection layer pattern to expose the opaque patterns and the substrate, growing an aluminum pattern using the opaque patterns as a seed, etching the substrate, anisotropically etching the aluminum patterns to expose an exposed portion of the substrate, and re-etching the exposed portion of the substrate to form a phase transition region and a phase shifting region.

In a second aspect of the present invention, there is provided a method of forming a phase shifting mask including the steps of forming a first metal layer on a substrate, patterning the first metal layer to form an opaque pattern, forming a photoresist pattern over at least a portion of the opaque pattern and the substrate, etching the substrate to form a recess, depositing a resist film over the opaque pattern, the photoresist pattern and the recess, selectively exposing the photoresist pattern, exposing a part of the opaque pattern and a portion of the substrate by selectively removing the photoresist pattern, forming a second metal pattern over sides and a top surface of the first metal layer and over a portion of the substrate, etching the substrate using the second metal pattern and the resist film as a mask, etching upper and side surfaces of the second metal layer and the substrate, and removing the resist film.

It is to be understood that both the foregoing general description and the following detailed description are exemplary and explanatory and are intended to provide further explanation of the invention as claimed.

Additional features and advantages of the present invention will be set forth in the description which follows, and will be apparent from the description, or may be learned by practice of the invention. The objectives and other advantages of the invention will be realized and attained by the structure and process particularly pointed out in the written description as well as in the appended claims.

BRIEF DESCRIPTION OF THE ATTACHED DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE PREFERRED EMBODIMENTS

Reference will now be made in detail to the preferred embodiments of the present invention, examples of which are illustrated in the accompanying drawings.

First, the method will be summarized as follows: the method includes the steps of forming a plurality of opaque patterns on a region of a transparent substrate, forming a first protection layer pattern to cover portions of the opaque patterns and the transparent substrate, etching the transparent substrate to form a transmissive portion using the opaque patterns and the first protection layer pattern as a mask, forming a second protection layer on respective upper surfaces of the transmissive portion, the opaque patterns and the first protection layer pattern, exposing the first protection layer pattern, removing the first protection layer pattern and exposing the opaque patterns and the transparent substrate, growing an aluminum layer using the exposed opaque patterns as a seed to form an aluminum pattern, etching the exposed transparent substrate, anisotropically etching the aluminum pattern, and re-etching the transparent substrate surface exposed by anisotropically etching the aluminum pattern to form a phase transition portion and a phase shifting portion.

Figure 1:
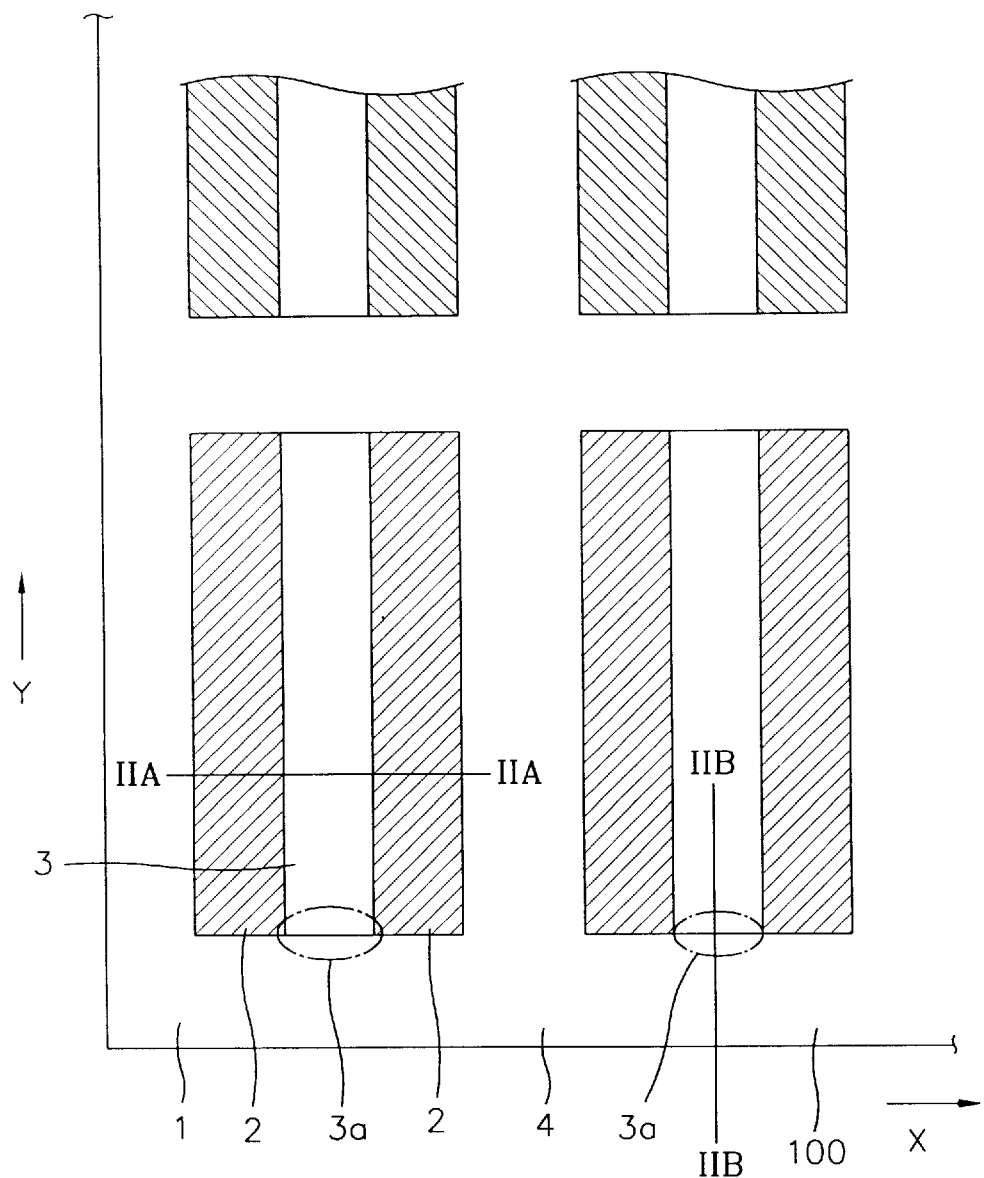
FIG. 1 is a plan view of a conventional phase shifting photomask for a semiconductor device.
Figure 2A:
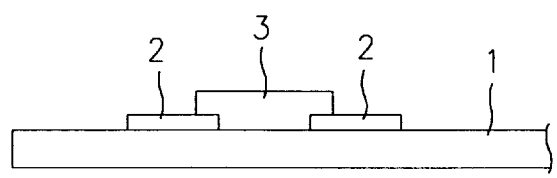
FIG. 2A is a cross-sectional view taken along line IIA—IIA of FIG. 1.
Figure 2B:
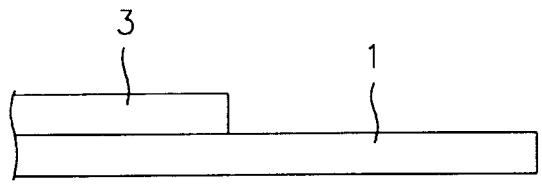
FIG. 2B is a cross-sectional view taken along line IIB—IIB of FIG. 1.
Figure 3:
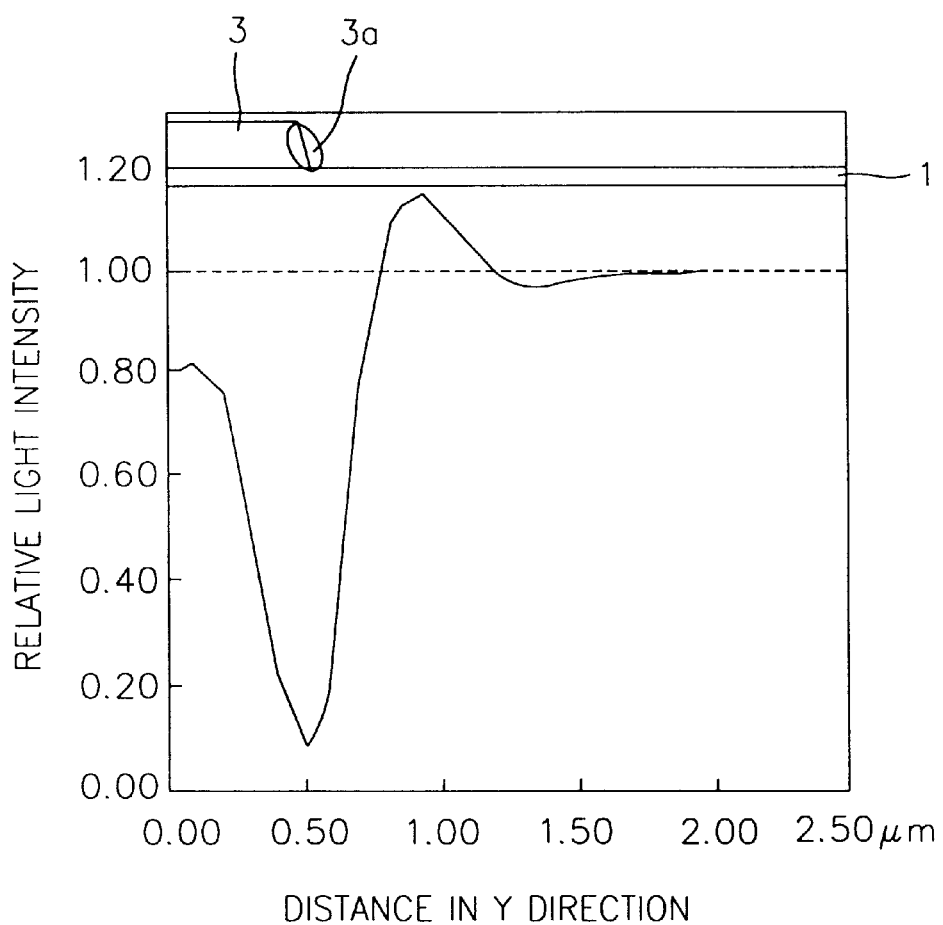
FIG. 3 is a graph illustrating the variations in light intensity versus distance of the phase shifting photomask of FIG. 2B.
Figure 4:
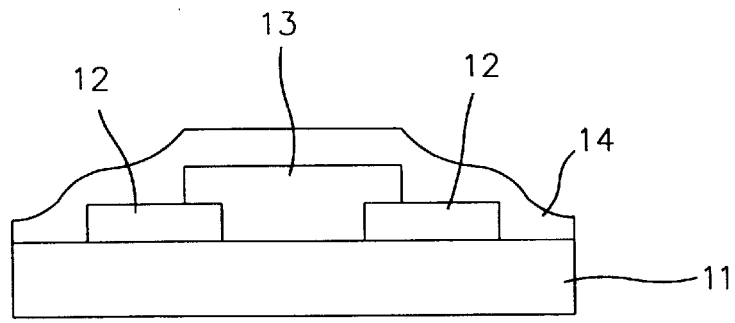
FIG. 4 is a cross-sectional view of a conventional phase shifting photomask having a phase transition layer.
Figure 5A:
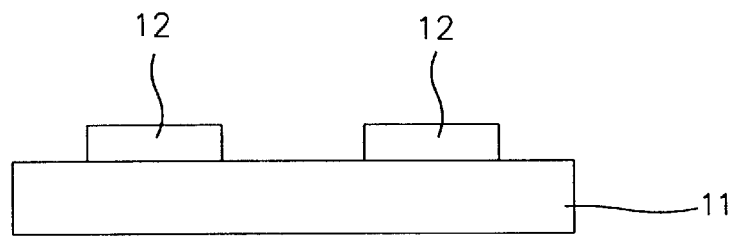
FIGS. 5A–5C are process views of the conventional phase shifting photomask of FIG. 4.
Figure 5B:
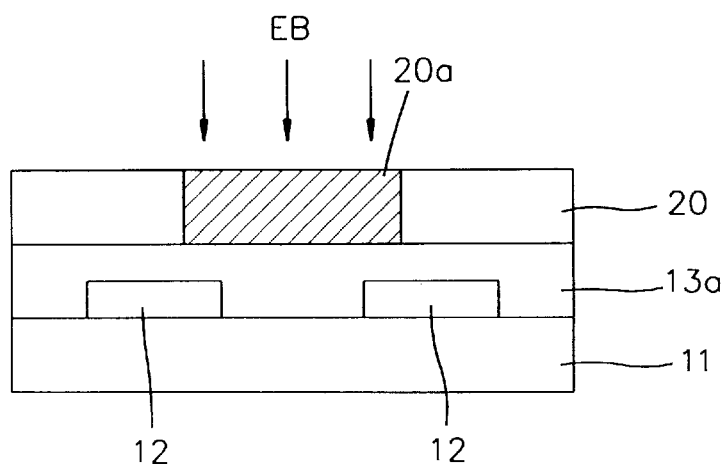
Figure 5C:
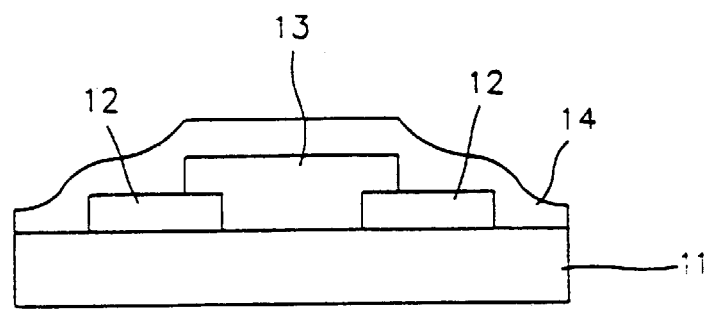
Figure 6:
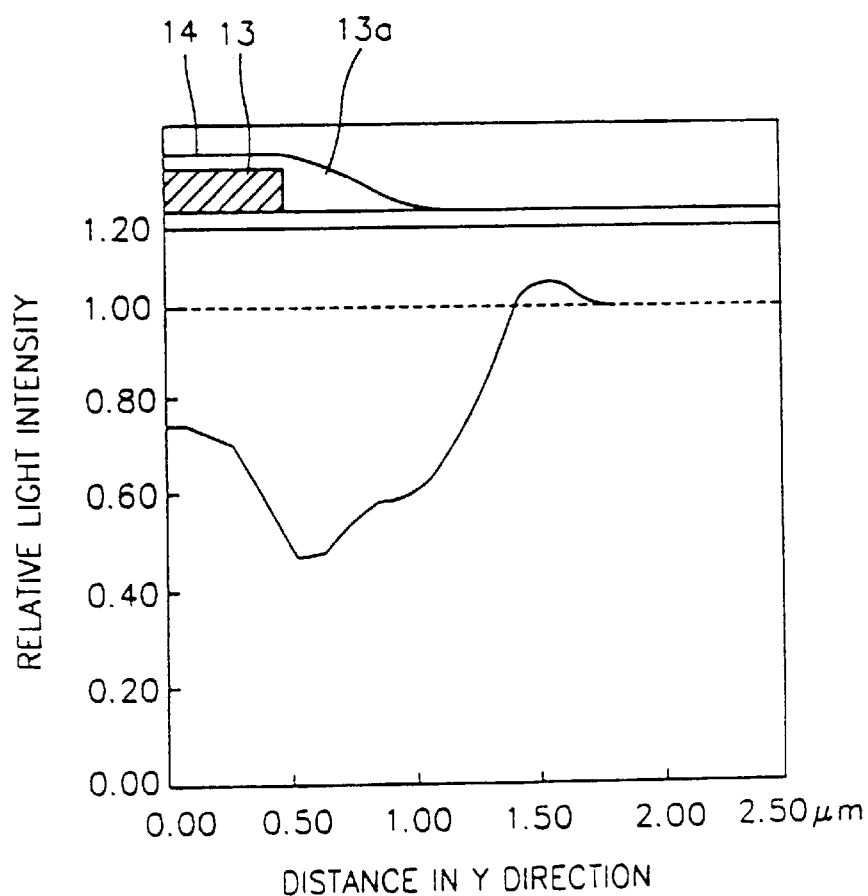
FIG. 6 is a graph illustrating the variation in light intensity versus distance of the conventional phase shifting photomask of FIG. 4.
Figure 7:
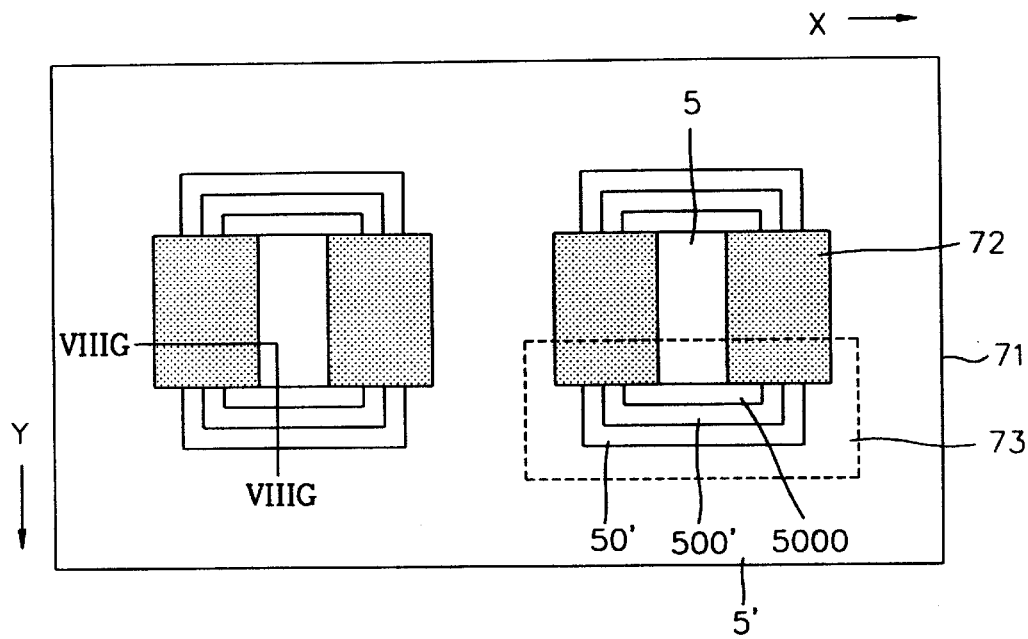
FIG. 7 is a plan view of a phase shifting photomask for a semiconductor device according to the present invention.

FIG. 7 is a plan view of the phase shifting photomask according to the present invention. A transparent substrate 71 has a pedestal 5 having an opaque pattern 72 formed on each side. The portion of the pedestal 5 between the opaque patterns 72 serves as a phase shifter 75. Along a Y-axis and on each side of the pedestal 5, a phase transition portion 73 of steps 50", 500', 5000 is formed. The recessed portion of the transparent substrate 71, other than the pedestal 5 and the steps 50", 500', 5000 forms a recess 5'. The phase transition portion 73 does not reduce light transmission while gradualizing the phase shift, overcoming the disadvantages of a conventional phase shifting photomask.

The fabrication steps of the phase shifting photomask according to the present invention will now be described with reference to FIGS. 8A–8G.

Figure 8A:
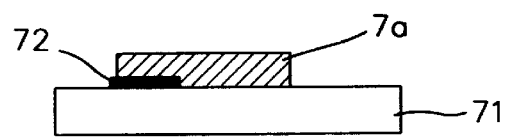
FIGS. 8A–8F are process views illustrating the fabrication of a phase shifting mask according to the present invention.

First, as shown in FIG. 8A, a chromium layer that will serve as an opaque layer is formed on the transparent substrate 71 using a sputtering and evaporation method. The chromium layer is patterned so as to form a plurality of opaque patterns 72. A photoresist pattern 7a is formed to cover portions of the opaque patterns 72 and an upper surface portion of the transparent substrate 71 that will serve as a phase transition portion 73.

Figure 8B:
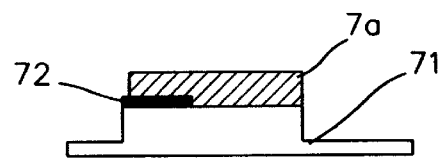

As further shown in FIG. 8B, using the opaque patterns 72 and the photoresist pattern 7a as a mask, the transparent substrate 71 is etched to form the recess 5' in the transparent substrate 71. The etching process to form the recess 5' is carried out to an appropriate depth into the substrate 71 so as to be sufficient to change the phase-shifting characteristic relative to the pedestal 5. When the phase-shifted photomask is completed, the recess 5' serves as a transmissive portion.

Figure 8C:
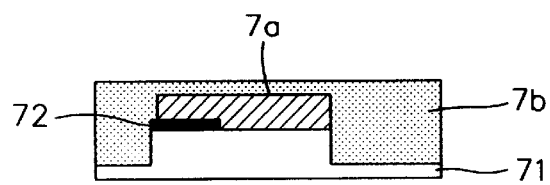
Figure 8D:
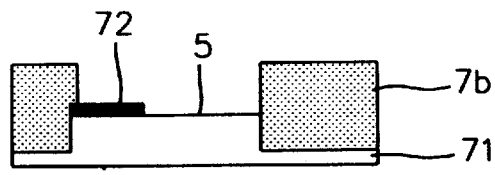

Referring to FIG. 8C, an inorganic resist film 7b belonging to a Ge—Se family is formed to entirely cover the opaque patterns 72, the photoresist pattern 7a and the recess 5' of the transparent substrate 71 by using a sputtering and evaporation method. At this time, the inorganic resist film 7b, which is a positive type, is formed at a temperature of about 21° C., which is a glass transition point. A chemical mechanical polishing is applied to the inorganic resist film 7b in order to expose the photoresist pattern 7a. The exposed photoresist pattern 7a is selectively removed using $O_2$ plasma or $CF_4$ gas, whereby portions of the opaque patterns 72 and the upper surface of the transparent substrate 71 at the pedestal 5 become exposed, as shown in FIG. 8D.

Figure 8E:
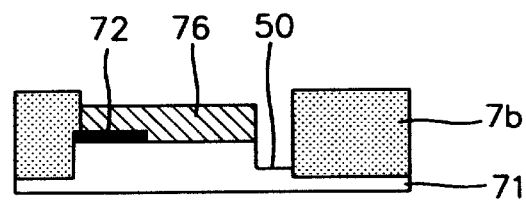

With reference to FIG. 8E, using the opaque patterns 72 made of chromium as a seed, and using a DMAH gas (dimethyl aluminum hydride, or $Al(CH_3)_2H$), an aluminum pattern 76 is grown on the upper and side surfaces of the opaque patterns 72. It is generally known that the DMAH gas tends to be selectively deposited on a conductive metal under a required temperature and pressure, and the growth rate can increase under a pressure of 0.5–50 Torr at a temperature ranging from 180° C. to 350° C., and under a DMAH partial pressure of 33–850 mTorr at a temperature of 180° C. The grown aluminum pattern 76 is selectively formed on the entire chromium pattern 72 and the surface portion of the transparent substrate 71. Then, as shown in FIG. 8E, using the inorganic resist pattern 7b remaining after the chemical mechanical polishing and the aluminum pattern 76 as a mask, the exposed surface of the transparent substrate 71 is anisotropically etched to obtain an etched step 50. This is done using standard photolithographic techniques, such as light-exposing and selective etching, that are well known in the art.

Figure 8F:
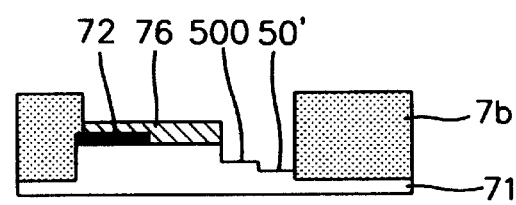

Next, as shown in FIG. 8F, using a solution such as $H_2SO_4$, the upper and side surfaces of the aluminum pattern 76 are etched, and the exposed transparent substrate 71 is dry-etched again to form another etched step 500. The etched step 50 becomes re-etched and produces an etched step 50'. A dry etching is carried out to the upper and side surfaces of the aluminum pattern 76 and a dry etching is carried out to the exposed surface of the transparent substrate 71 repeatedly, using the $H_2SO_4$ solution, obtaining a stepped pattern having etched steps 5000, 500', 50''. In the etching process, when the opaque pattern 72 is formed of chromium, the aluminum pattern 76 becomes entirely removed during the etching process because of the high etching selectivity of chromium compared to aluminum with regard to a $H_2SO$ solution, and the etching process is stably completed when the chromium pattern 72 becomes exposed.

Figure 8G:
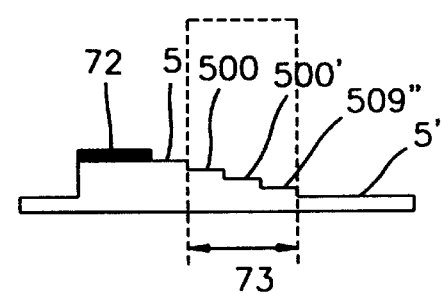
FIG. 8G is a cross-sectional view taken along line VIIIG—VIIIG of FIG. 7.

Referring to FIG. 8G, the inorganic resist film 7b is removed using a 6 mole % ammonium solution, completing the stepped phase shifted photomask.

Consequently, the phase transition portion 73 having additive steps 5000, 500', 50'' is gradually formed along the border between the phase shifting region 75 and the transparent substrate 71, thereby gradualizing the phase shift and preventing the light intensity from being degraded at the phase shift border.

As described above, the phase shifting photomask fabrication method according to the present invention utilizes the fact that an aluminum pattern grows only on a metallic layer, so that a decreased phase shifting region is formed without requiring an additional mask or an additional exposure step, simplifying the fabrication process.

Further, the phase shifting photomask fabrication method according to the present invention uses self-alignment, facilitating border control, line width control, and step control between the phase transition portion and the transmissive portion.

Still further, the phase shifting photomask fabrication method according to the present invention uses an inorganic resist film that has an etching durability with regard to the photoresist, the aluminum layer, and the transparent substrate, so that an excellent protection film effect results when carrying out the multi-step etching of the phase transition portion and the light passing portion.

Also, the phase shifting photomask fabrication method of the present invention uses a material having a high light transmissivity for the phase shifting portion and the light passing portion, achieving high resolution.

While the invention has been described in detail and with reference to specific embodiments thereof, it will be apparent to one skilled in the art that various changes and modifications can be made therein without departing from the spirit and scope thereof. Thus, it is intended that the present invention cover the modifications and variations of this invention provided they come within the scope of the appended claims and their equivalents.

What is claimed is:

1. A phase shifting photomask fabrication method comprising the steps of:

forming opaque patterns on a substrate;

forming a first protection layer pattern covering portions of the opaque patterns and the substrate;

etching the substrate to form a recessed transmissive portion using the opaque patterns and the first protection layer pattern as a mask;

forming a second protection layer over the transmissive portion, the opaque patterns and the first protection layer pattern;

removing a portion of the second protection layer to expose the first protection layer pattern;

removing the first protection layer pattern to expose the opaque patterns and the substrate;

growing an aluminum pattern using the opaque patterns as a seed;

etching the substrate;

anisotropically etching the aluminum pattern to expose an exposed portion of the substrate; and re-etching the exposed portion of the substrate to form a phase transition region and a phase shifting region.

2. The method of claim 1, wherein the steps of etching the transparent substrate and anisotropically etching the aluminum pattern are repeated.

3. The method of claim 1, wherein the step of forming opaque patterns uses chromium.

4. The method of claim 1, wherein the step of forming the opaque patterns uses a sputtering method and an evaporation method.

5. The method of claim 1, wherein the step of forming the first protection layer comprises forming a photoresist layer.

6. The method of claim 1, wherein the step of forming the second protection layer comprises forming an inorganic resist layer.

7. The method of claim 1, wherein the step of forming second protection layer uses a sputtering method and an evaporation method.

8. The method of claim 1, wherein the step of forming the second protection layer occurs at a temperature of about 210° C.

9. The method of claim 1, wherein the step of forming the second protection layer comprises forming a positive type photoresist layer.

10. The method of claim 1, wherein the second protection layer is removed using a chemical mechanical polishing method to expose the first protection layer.

11. The method of claim 1, wherein the step of removing the first protect layer uses a compound selected from a group consisting of an $O_2$ plasma and a $CF_4$ gas.

12. The method of claim 1, wherein the step of growing the aluminum pattern uses $Al(CH_3)_2H$).

13. The method of claim 1, wherein the step of growing an aluminum pattern occurs at a temperature of between 180° C. and 350° C. under a total pressure of 0.5–50 Torr, and a $Al(CH_3)_2H$ partial pressure of 33–850 mTorr during.

14. The method of claim 1, wherein the step of anisotropically etching the aluminum pattern uses an $H_2SO_4$ solution.

15. The method of claim 10, wherein the second protection layer is removed using a 6 mole % ammonium solution.

16. A method of forming a phase shifting mask comprising the steps of:

forming a first metal layer on a substrate;

patterning the first metal layer to form an opaque pattern;

forming a photoresist pattern over at least a portion of the opaque pattern and the substrate;

etching the substrate to form a recess;

depositing a resist film over the opaque pattern, the photoresist pattern and the recess;

exposing the photoresist pattern;

exposing a part of the opaque pattern and a portion of the substrate by selectively removing the photoresist pattern;

forming a second metal pattern over sides and a top surface of the first metal layer and over a portion of the substrate;

etching the substrate using the second metal pattern and the resist film as a mask;

etching upper and side surfaces of the second metal layer and the substrate; and removing the resist film.

17. The method of claim 16, wherein the step of forming the first metal layer comprises forming a chromium layer.

18. The method of claim 16, wherein the step of depositing the resist film comprises depositing an inorganic film belonging to a Ge—Se family.

19. The method of claim 16, wherein the step of depositing the resist film comprises sputtering and evaporation.

20. The method of claim 16, wherein the step of depositing the resist film uses a temperature of about 210 degrees C.

21. The method of claim 16, wherein the step of exposing the photoresist pattern uses a chemical mechanical polishing.

22. The method of claim 16, wherein the step of exposing a portion of the opaque pattern and the substrate by selectively removing the photoresist pattern uses a compound selected from a group consisting of an $O_2$ plasma and a $CF_4$ gas.

23. The method of claim 16, wherein the step of forming a second metal pattern utilizes the first metal layer as a seed.

24. The method of claim 16, wherein the step of forming the second metal pattern comprises forming an aluminum pattern.

25. The method of claim 16, wherein the step of forming a second metal pattern utilizes dimethyl aluminum hydride.

26. The method of claim 16, wherein the step of forming a second metal pattern utilizes dimethyl aluminum hydride gas at pressure of between 0.5 and 50 Torr, a temperature of between 180 degrees and 350 degrees C., and a dimethyl aluminum hydride partial pressure of 33–850 mTorr.

27. The method of claim 16, wherein the step of removing the resist film uses a 6 mole % ammonium solution.

28. The method of claim 16, wherein the step of etching the substrate using the second metal pattern and the resist film as a mask comprises anisotropic etching.

* * * * *